United States Patent
Kosugi et al.

(10) Patent No.: US 6,629,769 B2
(45) Date of Patent: Oct. 7, 2003

(54) POLYESTER RESIN COMPOSITION AND LIGHT-REFLECTING MOLDED ARTICLE THEREOF

(75) Inventors: Satoshi Kosugi, Ohtsu (JP); Nori Yoshihara, Ohtsu (JP); Koji Nakanishi, Ohtsu (JP)

(73) Assignee: Toyo Boseki Kabushiki Kaisha, Osaka (JP)

( * ) Notice: Subject to any disclaimer, the term of this patent is extended or adjusted under 35 U.S.C. 154(b) by 0 days.

(21) Appl. No.: 10/013,546

(22) Filed: Dec. 13, 2001

(65) Prior Publication Data
US 2002/0075686 A1 Jun. 20, 2002

(30) Foreign Application Priority Data
Dec. 15, 2000 (JP) .................................. 2000-382275

(51) Int. Cl.$^7$ .......................... F21V 7/00; B32B 15/08
(52) U.S. Cl. .................... 362/341; 362/296; 362/516; 428/458; 525/444
(58) Field of Search ................................ 362/341, 296, 362/516; 428/458, 480, 141, 912.2; 252/444

(56) References Cited

U.S. PATENT DOCUMENTS

| | | | | |
|---|---|---|---|---|
| 5,251,064 A | * | 10/1993 | Tennant et al. | 359/361 |
| 6,390,638 B1 | * | 5/2002 | Miller et al. | 362/31 |
| 6,492,031 B1 | * | 12/2002 | Moriyama et al. | 428/458 |

FOREIGN PATENT DOCUMENTS

JP        8-208959        8/1996

* cited by examiner

*Primary Examiner*—Sandra O'Shea
*Assistant Examiner*—Ali Alavi

(57) ABSTRACT

A light-reflecting molded article is constituted of a molded article made from a polyester resin composition and a light-reflecting metal layer formed on the molded article. The light-reflecting molded article has an average surface roughness of at most 0.3 μm and a deflection temperature under load of at least 160° C. The polyester resin composition includes 100 parts by weight of polybutylene terephthalate resin and 1 to 100 parts by weight of polyalkylene naphthalate resin.

15 Claims, No Drawings

POLYESTER RESIN COMPOSITION AND LIGHT-REFLECTING MOLDED ARTICLE THEREOF

BACKGROUND OF THE INVENTION

1. Field of the Invention

The present invention relates to polyester resin compositions used for light-reflecting molded articles. More specifically, the invention relates to a polyester resin composition from which a molded article having a highly glossy surface is produced with a relatively small amount of gas generated in the molding process. The small amount of generated gas allows a light-reflecting metal layer to be formed directly on the molded article without undercoating therebetween. The resultant molded article is excellent in specular reflection properties and luminous brightness and further excellent in maintenance of its surface appearance when used under high temperatures (i.e. thermal resistance) as well as adhesiveness to the metal layer. The light-reflecting metal layer is formed on the molded article by coating and/or vapor deposition.

The polyester resin composition according to the present invention is suitably used for lamp-related parts in the fields of automobile, building equipment and various industries. In particular, this polyester resin composition is suitably used for lamp reflectors, extensions and the like which are lamp-related parts of automobiles required to have high surface luminous brightness, smoothness and light reflectance.

2. Description of the Background Art

A light reflector, particularly for an extension, for example, which is one of lamp-related parts of an automobile is usually required to have high luminous brightness and smoothness, uniform light reflectance, high thermal resistance and the like for the directional and reflective properties of a lamp source. Accordingly, a crystalline thermoplastic polyester resin which is superior in mechanical and electrical properties as well as physical and chemical properties and further excellent in processability has been used as a material from which such a reflector is produced. In particular, a polybutylene terephthalate resin is used solely or used as a mixture thereof with a polyethylene terephthalate resin to which various reinforcing agents are added and blended therewith. A pretreatment such as undercoating is applied to a resultant molded article and thereafter a light-reflecting metal layer is formed thereon by means of vacuum deposition for example and thus a desired light reflector is produced.

The undercoating, however, leads to a considerable increase in cost, and thus a light reflector without undercoating that still exhibits a high luminous brightness and has a highly dense deposited layer is desired. In order for a reflector, which is formed of a molded article having at least one surface provided with a light-reflecting layer without undercoating therebetween, to have a high luminous brightness and a uniform reflectance, it is necessary that the resin molded article itself exhibits a superior surface smoothness as well as high gloss and luminous brightness.

Moreover, in terms of applications of the reflector, the thermal resistance of resin is an important issue. In general, the polybutylene terephthalate resin has a high crystallization speed and thus is solidified relatively quickly in a mold. Therefore, it is difficult to achieve a satisfactory specular transcription. In addition, when inorganic fillers such as talc and mica are added to the resin for providing a thermal resistance thereto, such fillers could be isolated and become visible (appearance on the surface). Then, according to a method employed for producing a molded article excellent in gloss and surface properties, the method being devised in consideration of materials for the molded article, an amorphous polymer is added to the polybutylene terephthalate resin in order to lower the crystallization speed thereof and thus improve the mold transcription and further prevent the filler from being isolated and becoming visible (appearance on the surface).

There are also methods devised in consideration of the molding process. For example, according to one of such methods generally employed, the resin temperature is increased to enhance the flowability. According to another method, the mold temperature is increased to lower the crystallization speed and thus improve the mold transcription. Although those methods improve the appearance of the molded article to some degree, the increased resin temperature and the increased mold temperature result in a noticeable generation of gas in the molding process and accordingly cause any defect in the appearance such as tarnishing (haze) on the surface of the molded article. Therefore, these methods cannot successively produce satisfactory molded articles and require additional polishing, wiping and the like of the mold. Further, the addition of the amorphous polymer deteriorates, if the amorphous polymer itself has a low thermal resistance, the surface and luminous brightness properties of the molded article when used under high temperatures, so that the molded article employed as a light reflector has a deteriorated thermal resistance level. Moreover, an amorphous polymer with a high glass transition temperature generally has a low solublity with respect to the polybutylene terephthalate resin so that superior surface properties are impossible to achieve.

SUMMARY OF THE INVENTION

One object of the present invention is to produce a polyester resin composition used for a light-reflecting molded article having an excellent luminous brightness and a high reflectance as well as a satisfactory adhesiveness to metal even if a light-reflecting metal layer is directly vapor-deposited on a resin molded article without undercoating, and further having a thermal resistance which allows such properties to be maintained when the molded article is used under high temperatures. In order to accomplish this object, the inventors of the present invention have conducted dedicated studies to achieve the present invention.

The present invention is a light-reflecting molded article constituted of a molded article made from a polyester resin composition and a light-reflecting metal layer formed on the molded article. The light-reflecting molded article has an average surface roughness of at most 0.3 $\mu$m and a deflection temperature under load of at least 160° C.

The present invention is a polyester resin composition from which a molded article is made, a light-reflecting metal layer being formed on the molded article to produce a light-reflecting molded article. The polyester resin composition includes 100 parts by weight of polybutylene terephthalate resin (component A) and 1 to 100 parts by weight of polyalkylene naphthalate resin (component B).

According to the present invention, the polybutylene terephthalate resin (component A) has a content of carboxyl group at the end of polymer chain that is at most 70 meq/kg.

Preferably, at least 75% by molar fraction of a 1,4-butanediol unit is contained in the total diol component of the polyalkylene naphthalate resin (component B).

According to the invention, the polyester resin composition includes 100 parts by weight of polybutylene terephthalate resin (component A) and 1 to 50 parts by weight of polyalkylene naphthalate resin (component B).

Preferably, the light-reflecting metal layer is formed by vapor deposition to exhibit specular gloss. Still preferably, metal in the light-reflecting metal layer is aluminum.

Moreover, according to the present invention, the molded article has at least a part thereof on which the light-reflecting metal layer is directly formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A polyester resin composition according to the present invention has a structure described in detail below.

The present invention is a light-reflecting molded article constituted of a molded article made from a polyester resin composition and a light-reflecting metal layer formed on the molded article. The light-reflecting molded article has an average surface roughness of at most 0.3 μm and a deflection temperature under load of at least 160° C.

The average surface roughness of the molded article relates to diffuse reflection of light and affects the luminous brightness of the molded article. It is thus required that the average surface roughness is at most 0.3 μm, preferably at most 0.28 μm. Further, the deflection temperature under load relates to deterioration, due to deformation or deflection, of light orientation and adhesiveness to metal. Around a lamp, the temperature is at least 160° C. and preferably at least 170° C.

The molded article of the present invention as described above is suitably produced by using a polyester resin composition including 100 parts by weight of polybutylene terephthalate resin (component A) and 1 to 100 parts by weight of polyalkylene naphthalate resin (component B).

<Polybutylene Terephthalate Resin>

According to the present invention, polybutylene terephthalate resin refers to a polybutylene terephthalate produced through polycondensation of terephthalic acid or its ester-formable derivative and alkylene glycol of carbon number 4 or its ester-formable derivative. Preferably, the polybutylene terephthalate may be a copolymer containing at least 70% by weight of a butylene terephthalate unit in its molecular chain.

In the copolymer, a monomer is included as a dibasic acid component other than the terephthalic acid and its lower alcohol ester, and the monomer used here is aliphatic acid or aromatic polybasic acid such as isophthalic acid, naphthalene dicarboxylic acid, adipic acid, sebacic acid, trimellitic acid and succinic acid, and their ester-formable derivatives, for example.

In the copolymer, a glycol component other than 1,4-butanediol is included, and the glycol component used here is general alkylene glycol such as ethylene glycol, diethylene glycol, propylene glycol, trimethylene glycol, hexamethylene glycol, neopentyl glycol and cyclohexane dimethanol, lower alkylene glycol such as 1,3-octanediol, aromatic alcohol such as bisphenol A and 4,4'-dihydroxy biphenyl, alkylene oxide adduct alcohol such as ethylene oxide 2-mol adduct of bisphenol A and propylene oxide 3-mol adduct of bisphenol A, polyhydroxy compound such as glycerin and pentaerythritol, or its ester-formable derivative, for example.

According to the present invention, component A can be the polybutylene terephthalate produced by polycondensation of the compounds as described above as monomer components, or the copolymer containing polybutylene terephthalate and other bonding units of monomers. Component A contains polybutylene terephthalate solely or at least two types thereof which are mixed. Preferably, a polybutylene terephthalate homopolymer is used.

Further, according to the present invention, a branching polymer which is one of the copolymers may be used. For example, a polyester such as polybutylene terephthalate branching polymer may be used which mainly contains polybutylene terephthalate or butylene terephthalate monomer to which a multifunctional compound is added for branching. Examples of the multifunctional compound are trimesic acid, trimellitic acid, pyromellitic acid and alcohol ester thereof, glycerin, trimethylolethane, trimethylolpropane and pentaerythritol.

Preferably, the content of carboxyl group at the end of polymer chain in the polybutylene terephthalate resin of the present invention is preferably 70 meq/kg or less. More preferably, the content is 40 meq/kg or less, and still more preferably 30 meq/kg or less. The content of carboxyl end group that is 70 meq/kg or less provides a remarkable reduction of haze on a resultant molded article, and thus such a content is particularly preferable for application to light-reflecting molded articles.

The carboxyl group content is measured by using a sample obtained by crushing polybutylene terephthalate resultant from polycondensation of monomers as described above, dissolving the sample in benzyl alcohol at 215° C. for 10 minutes, and thereafter determining the content by titration using a 0.0 1N aqueous solution of sodium hydroxide.

The polybutylene terephthalate resin according to the present invention has a weight-average molecular weight (Mw) ranging from 10,000 to 50,000 and a specific reduced viscosity ranging from 0.5 to 2.0 dl/g.

Here, the specific reduced viscosity is measured by the following method. A solvent mixture of phenol and tetrachloroethane with the weight ratio of 6:4 is used, and, under conditions of a temperature of 30° C. and a concentration of 0.4 g/dl and by means of an Ostwald viscometer, the falling time is measured through comparison with the solvent.

<Polyalkylene Naphthalate Resin>

The polyester resin composition according to the present invention contains component A as detailed above with which polyalkylene naphthalate resin (component B) is blended. The polyalkylene naphthalate resin (component B) blended with the polybutylene terephthalate resin (component A) is a requisite component for improvement of such properties as surface smoothness and luminous brightness of resultant molded article and light-reflecting metal layer. Polyalkylene naphthalate has a lower crystallization speed and a smaller coefficient of linear expansion than those of polybutylene terephthalate and is accordingly effective because it improves the mold transcription of the resin composition when blended therein. Moreover, polyalkylene naphthalate has a higher deflection temperature under load than that of polybutylene terephthalate and is thus effective because it prevents deterioration of the surface smoothness and luminous brightness as well as deformation, for example, when the molded article having the light-reflecting layer is exposed to high temperature like light and heat. In view of these two effects described above, the polyalkylene naphthalate resin is a requisite component for the present invention for achieving a light-reflecting article of superior appearance.

The polyalkylene naphthalate resin (component B) according to the present invention is a polymer produced by polycondensation of naphthalic acid or its ester-formable derivative and alkylene glycol of carbon number 2 to 8 or its ester-formable derivative. Preferably, the polyalkylene naphthalate resin may be a copolymer containing at least 70 mol % of an alkylene naphthalate unit in its molecular chain.

The copolymer of polyalkylene naphthalate resin according to the present invention contains a monomer as an acid component other than naphthalenedicarboxylic acid that is specifically aliphatic acid or aromatic polybasic acid such as terephthalic acid, isophthalic acid, adipic acid, sebacic acid, trimellitic acid and succinic acid and their ester-formable derivatives, for example. Preferred acid components are naphthalenedicarboxylic acid, terephthalic acid and isophthalic acid. In particular, only the naphthalene dicarboxylic acid is used.

The polyalkylene naphthalate resin according to the present invention contains, as a diol component, general alkylene glycol such as diethylene glycol, propylene glycol, 1,4-butanediol, hexamethylene glycol, neopentyl glycol and cyclohexane dimethanol, lower alkylene glycol such as 1,3-octanediol, alkylene oxide adduct alcohol such as ethylene oxide 2-mol adduct of bisphenol A and propylene oxide 3-mol adduct of bisphenol A, polyhydroxy compound such as glycerin and pentaerythritol, or its ester-formable derivative, for example. Preferred diol components are ethylene glycol, propylene glycol and 1,4-butanediol. In particular, only the 1,4-butanediol is used.

The polyalkylene naphthalate resin described above has a weight-average molecular weight (Mw) ranging from 5,000 to 50,000 and a specific reduced viscosity ranging from 0.5 to 2.0 dl/g.

According to the present invention, with 100 parts by weight of the polybutylene terephthalate resin (component A), 1 to 100 parts, preferably 1 to 50 parts, and more preferably 15 to 40 parts by weight of the polyalkylene naphthalate resin is blended.

Less than 1 parts by weight of component B is not preferable since it results in a smaller effect of reducing the coefficient of linear expansion, and a required luminous brightness is not attained. More than 100 parts by weight of component B causes the resin to be adhered closely to the mold and thus leads to failure in molding, or considerably extends the cooling time, so that the moldability deteriorates to a great degree, and accordingly is not preferable. In addition, this is inappropriate for practical use because of a lower cost efficiency.

<Additives>

Moreover, according to the present invention, an antioxidant may be added for enhancing the thermal stability of the resin composition constituting the light reflector when the resin composition is being molded and for preventing the appearance and luminous brightness from deteriorating due to gas generated from the resin composition particularly when compositions are successively molded, low molecular weight component and any component appearing on the surface, for example.

Preferably, the antioxidant employable according to the invention is one or a combination of at least two selected from hindered phenols, thioethers and organic phosphates. Addition of such an antioxidant is effective for improvement of the melt thermal stability in an extruding process or in a molding machine and advantageous in that molded articles with less surface haze and excellent appearance and surface properties are successively produced. Further, addition of the antioxidant is particularly advantageous, when the light reflector is under high temperature conditions, in that gas is prevented from being generated from the resin and generation of any decomposed material is avoided, and thus satisfactory appearance and surface properties are maintained.

Specific examples of the employed antioxidant are as follows. Examples of hindered phenol are tetrakis[methylene-3-(3,5-di-t-butyl-4-hydroxyphenyl)propionate]methane, triethylene glycol-bis[3-(3-t-butyl-5-methyl-4-hydroxyphenyl)propionate and 1,6-hexanediol-bis[3-(3,5-di-t-butyl-4-hydroxyphenyl)propionate], for example. Examples of thioether are tetrakis[methylene-3-(dodecylthio)propionate]methane, dimyristylthiodipropionate and didodecylthiodipropionate, for example. Examples of organic phosphate are bis(2,6-di-t-4-methylphenyl) pentaerythritol diphosphate, bis(2,4-di-t-butylphenyl)pentaerythritol diphosphate, tetrakis(2,4-di-t-butylphenyl)-4,4'-biphenylene phosphate, and tris(2,4-di-t-butylphenyl)phosphate, for example. Particularly effective combinations are a combination of hindered phenol and thioether, a combination of hindered phenol and organic phosphate and a combination of the three types of antioxidants.

Instead of the antioxidant of organic phosphate, metal phosphate is preferably employed such as monohydrates of calcium primary phosphate and sodium primary phosphate.

Further, according to the present invention, one or at least two compounds may be added for improving the mold releasability of a product in a molding process and enhancing the appearance of the molded product. Specifically, the compound(s) is (are) selected from fatty acid esters, typical examples thereof being glycerin fatty acid esters, sorbitan fatty acid esters, stearates and montanoic acid esters, and partially saponified compounds thereof, polyether-based compounds, higher fatty acid metal salts, trimellitic acid esters, and pyromellitic acid esters.

To 100 parts by weight of the polybutylene terephthalate (component A), 0 to 2.0 parts by weight of the compound(s) as described above are added. A greater amount of such compounds added to component A could result in noticeable haze and any material appearing on the surface depending on the temperature in use and thus is not preferable.

According to the present invention, an inorganic reinforcing agent may be added for improving the thermal resistance for example. To 100 parts by weight of the polyester resin composition, less than 10 parts by weight of the inorganic reinforcing agent may be added. Specific examples of the reinforcing agent are fibrous reinforcing agents such as glass fiber and carbon fiber, potassium titanate, and inorganic fillers such as talc, warastnite, silica, clay, calcium carbonate and glass beads. At least one of those reinforcing agents may be added to the resin composition of the present invention.

In addition, the composition of the present invention may contain well-known additives which are generally added to a thermoplastic resin for example in order to add desired characteristics to the resin depending on applications thereof. For example, antistatic agent, mold-releasing agent and coloring agents like dye and pigment, for example, may be added to and blended with the resin composition.

<Preparation of Composition>

The composition of the present invention is readily prepared by means of facilities and method that have commonly been employed for preparing a resin composition. Various methods are available, for example, (1) components of predetermined amounts respectively that constitute the composition of the present invention are mixed all together, melted and kneaded by a monoaxial or biaxial extruder to produce a pellet having an intended composition, (2) by means of a monoaxial or biaxial extruder having at least two openings through which materials are supplied, resin, stabilizer, pigment components for example are provided from the first opening and they are melted and kneaded, an inorganic filler is thereafter provided from the second opening, melted and kneaded, and thus a pellet with an intended composition is produced, or by any of other applicable methods.

The composition of the present invention can be molded into a molded article by such methods as injection molding and injection compression molding. The injection molding method is generally employed.

A light-reflecting metal layer can be formed on the molded article for example by sputtering, or vacuum deposition. Here, the layer deposited thereon has a thickness of at most 0.1 μm.

According to the present invention, examples of the metal constituting the light-reflecting metal layer are gold, silver, copper, aluminum, tin, lead, zinc, platinum, titanium, manganese, chromium, iron, nickel, cobalt, silicon, germanium, gallium, molybdenum, and alloy containing such metals by at least 50%. In particular, aluminum and aluminum alloy are preferred according to the invention.

EXAMPLES

The present invention is now described specifically by means of examples. However, the invention is not limited to such examples. Items used for making evaluations were determined by the methods as detailed later below. Here, "parts" and "percent (%)" employed for representing the amounts of components refer to "parts by weight" and "percent by weight" respectively.

Components blended for producing the composition were as follows.

Thermoplastic polyester resin:
<Polybutylene Terephthalate Resin>
PBT-1: polybutylene terephthalate resin manufactured by Toray Industries, Inc. under the name of Toraycom, with $\eta_{sp}/c$ of 1.23 and the content of carboxyl group at the end of polymer chain (CEG content) of 30 meq/kg
<Polybutylene Terephthalate Resin>
PBT-2: polybutylene terephthalate resin manufactured by Toray Industries, Inc. under the name of Traycom with $\eta_{sp}/c$ of 0.85 and the CEG content of 80 meq/kg
<Polybutylene Naphthalate Resin>
PBN: polybutylene naphthalate resin manufactured by Toyobo. Co., Ltd. with $\eta_{sp}/c$ of 0.88
<Polyethylene Naphthalate Resin>
PEN: polyethylene naphthalate resin manufactured by Toyobo. Co., Ltd. with $\eta_{sp}/c$ of 0.75
<Polycarbonate Resin>
PC: polycarbonate manufactured by Sumitomo Dow Limited under the name of Calibre 301, with a melt flow rate (300° C., 1.18N) of 6 g/min
Inorganic reinforcing agent:
talc (grain size: 3.8 μm)
Fatty acid salt and/or fatty acid ester compound (referred to as Wax):
Wax-1: manufactured by Clariant (Japan) KK under the name of Hostamont CaV 102
Wax-2: manufactured by Clariant (Japan) KK under the name of Hostalub WE 40

(1) Appearance Evaluation

A molding process was performed under the following molding conditions, and a flat molded article of 100 mm×100 mm having a thickness of 2 mm and a molded article of 125 mm×125 mm with a thickness of 6.4 mm according to ASTM D648 were used.

Molding conditions:
Molding machine: Toshiba IS-80
Cylinder temperature (° C.) : 265–265–260–250
Injection speed: 2.0 m/min
Injection pressure: 400 kg/cm$^2$
Mold temperature: 80° C.

(2) Vapor Deposition

A vapor deposition apparatus was used for vapor deposition of the flat molded article. The pressure within the deposition apparatus was lowered to $1.0\times10^{-2}$ Pa and aluminum was vapor-deposited at a speed of 1.0 nm/sec to the thickness of 100 nm. The appearance of a light-reflecting surface of a light reflector thus produced was visually observed and scores used for evaluation here were as follows.

Score 1: high luminous brightness, a fluorescent lamp clearly seen in the surface without distortion Score 2: high luminous brightness, a fluorescent lamp seen in the surface without distortion, haze appearing slightly due to gas Score 3: haze appearing to some degree due to gas, a fluorescent lamp seen in the surface without distortion, the lamp being somewhat blurred Score 4: uneven surface causing a fluorescent lamp seen therein to be distorted to some degree, haze appearing due to gas Score 5: rough surface causing a fluorescent lamp seen therein to appear wavy, white haze appearing due to gas In addition, the light reflector was left at 160° C. for 24 hours and thereafter the appearance of the light-reflecting surface was visually observed and any score was given as described above.

(3) Surface Roughness

The flat molded plate (100 mm×100 mm×2 mm) used for the above-described appearance evaluation was employed for determining the average roughness (μm) of ten points thereof and measuring the maximum height (μm) by using a surface roughness measuring device (SURFCOM 554A manufactured by Tokyo Seimitsu Co., Ltd.).

(4) Deflection Temperature under Load (heat distortion temperature: HDT)

The temperature was measured according to ASTM D-648 (by using a measurement weight for providing a fiber stress of 0.46 MPa).

(5) Cross-Cut Adhesion Test

The adhesiveness of the aluminum film, which was formed on the flat molded article through vapor deposition, to the flat molded article was evaluated as follows. The flat molded plate (100 mm×100 mm×2 mm) at room temperature that was produced under the molding conditions described above and subjected to the vapor deposition by the above-described method was left for 24 to 48 hours in a chamber with a constant temperature of 23° C. and a constant humidity of 50%. For the cross-cut adhesion test, the film was cross-cut into a grid of 100 sections at 1 mm intervals and an adhesive cellophane tape manufactured by Nichiban Co., Ltd. was used. The cross-cut adhesion test was conducted five times for one example or comparative example. The number of remaining sections on the test plate surface was represented by percentage to make an evaluation.

Examples 1 and 3–6, Comparative Examples 1–3

PBT-1 and PBN were used and respective contents of the inorganic reinforcing agent and mold-releasing agent for example were varied as shown in Table 1. A biaxial extruder having a cylinder with its temperature set at 245–250–250–245° C., the first temperature being of the part closest to a nozzle, was used for melting and kneading the materials into a pellet. The resultant pellet was dried at 135° C. for 4 hours. After this, a molding machine with a cylinder temperature of 240 to 260° C. was used for injection molding by means of a chromium-plated mold with a surface temperature of 90° C. Thus, a test plate for evaluation was produced. Table 1 and Table 2 show results of evaluations.

Example 2

PEN was used instead of PBN of example 1. All of other conditions were the same as those of example 1 to produce a test plate for evaluation through melting, kneading and injection molding. Results of evaluations are shown in Table 1.

Example 7

PBT-2 was used instead of PBT-1 of example 1. All of other conditions were the same as those of example 1 to produce a test plate for evaluation through melting, kneading and injection molding. Results of evaluations are shown in Table 1.

Comparative Examples 4–7

Sheets to be evaluated were produced respectively through melting, kneading and injection molding as done for example 1, with the contents of PBT-1 and PBT-2 changed. Results of evaluations are shown in Table 2.

Example 8

The resin composition prepared in example 1 was used. The resin temperature and the mold temperature were set respectively at 265° C. and 60° C., and a reflector and an extension for a car headlamp (as shown in FIG. 1 of Japanese Patent Laying-Open No. 8-208959) was formed by injection molding. Under a vacuum of $1 \times 10^{-2}$ Pa, aluminum was heated to 1450° C. to be vapor-deposited on the entire surface. The resultant molded article without primer exhibits a high luminous brightness. Further, a cross-cut adhesion test was conducted for determining the adhesiveness of the deposited layer, and no peeling was observed.

Moreover, the extension with a metal layer deposited thereon was used for fabricating a lamp unit and a 168-hour continuous lighting test was conducted. As a result, no deformation and no swelling of the deposited layer were observed, which means a satisfactory thermal resistance was attained.

TABLE 1

| Example (E) | | | E1 | E2 | E3 | E4 | E5 | E6 | E7 |
|---|---|---|---|---|---|---|---|---|---|
| PBT-1 | | parts | 90 | 90 | 90 | 89.5 | 89.5 | 70 | |
| PBT-2 | | parts | | | | | | | 90 |
| PBN | | parts | 10 | | 10 | 10 | 10 | 25 | 10 |
| PEN | | parts | | 10 | | | | | |
| talc | | parts | | | 5 | | | 5 | |
| Wax-1 | | parts | | | | 0.5 | | | |
| Wax-2 | | parts | | | | | 0.5 | 0.5 | |
| appearance of light-reflecting surface | immediately after vapor deposition | | 1 | 1 | 1 | 1 | 1 | 1 | 2 |
| | 160° C./after 24 hrs | | 1 | 1 | 2 | 2 | 1 | 2 | 2 |
| surface smoothness (immediately after vapor deposition | 10-point av roughness | [μm] | 0.15 | 0.18 | 0.27 | 0.22 | 0.14 | 0.24 | 0.29 |
| | max height | [μm] | 0.27 | 0.29 | 0.37 | 0.35 | 0.24 | 0.36 | 0.37 |
| cross-cut adhesion test | immediately after vapor deposition | | 100 | 100 | 100 | 100 | 100 | 100 | 100 |
| | 160° C./after 24 hrs | | 100 | 100 | 98 | 95 | 100 | 99 | 100 |
| deflection temperature under load (0.46 MPa) | [° C.] | | 173 | 176 | 187 | 170 | 174 | 176 | 152 |

TABLE 2

| Comparative Example (CE) | | | CE1 | CE2 | CE3 | CE4 | CE5 | CE6 | CE7 |
|---|---|---|---|---|---|---|---|---|---|
| PBT-1 | | parts | 100 | 10 | 10 | 90 | 80 | 70 | |
| PBT-2 | | parts | | | | | | | 90 |
| PBN | | parts | | 80 | 85 | | | | |
| PC | | parts | | | | 10 | 20 | 30 | 10 |
| talc | | parts | | 10 | | | | | |
| Wax-1 | | parts | | | | 0.5 | 0.5 | 0.5 | 0.5 |
| Wax-2 | | parts | | | 5 | | | | |
| appearance of light-reflecting surface | immediately after vapor deposition | | 1 | 3 | 2 | 1 | 1 | 1 | 1 |
| | 160° C./after 24 hrs | | 4 | 5 | 5 | 4 | 4 | 5 | 4 |

TABLE 2-continued

| Comparative Example (CE) | | | CE1 | CE2 | CE3 | CE4 | CE5 | CE6 | CE7 |
|---|---|---|---|---|---|---|---|---|---|
| surface smoothness (immediately after vapor deposition | 10-point av roughness | [μm] | 0.36 | 1.31 | 0.28 | 0.31 | 0.26 | 0.25 | 0.22 |
| | max height | [μm] | 0.4 | 1.46 | 0.42 | 0.38 | 0.30 | 0.30 | 0.28 |
| cross-cut adhesion test | Immediately after vapor deposition | | 100 | 100 | 80 | 100 | 100 | 98 | 100 |
| | 160° C./after 24 hrs | | 100 | 95 | 25 | 100 | 100 | 92 | 100 |
| deflection temperature under load (0.46 MPa) | [° C.] | | 158 | 205 | 209 | 147 | 141 | 132 | 129 |

As heretofore discussed, the light-reflecting molded article produced from the polyester resin composition of the present invention exhibits a remarkably high luminous brightness, less deterioration, due to haze, of the luminous brightness under successive molding processes and high temperatures, and is excellent in adhesiveness to metal and thermal resistance. Such a light reflector is preferably applied to reflectors, extensions and the like of automobile lamps requiring a high reflectivity, and thus the reflector makes a great contribution to the industry.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light-reflecting molded article comprising a molded polyester resin composition article and a light-reflecting metal layer on said molded article, said light-reflecting molded article having, after being molded, an average surface roughness of, at most, 0.3 μm and a deflection temperature under load of at least 160° C.

2. A polyester resin composition from which a molded article is made, a light-reflecting metal layer being formed on said molded article to produce a light-reflecting molded article, said polyester resin composition including 100 parts by weight of polybutylene terephthalate resin and 1 to 100 parts by weight of polyalkylene naphthalate resin.

3. The polyester resin composition according to claim 2, wherein said polybutylene terephthalate resin has a content of carboxyl group at an end of a polymer chain that is, at most, 70 meq/kg.

4. The polyester resin composition according to claim 2, wherein at least 75%, by molar fraction, of a 1,4-butanediol unit is contained in the total diol component of said polyalkylene naphthalate resin.

5. The polyester resin composition according to claim 2, wherein said polyester resin composition includes 100 parts by weight of polybutylene terephthalate resin and 1 to 50 parts by weight of polyalkylene naphthalate resin.

6. The polyester resin composition according to claim 2, wherein said light-reflecting metal layer is formed by vapor deposition and exhibits a specular gloss.

7. The polyester resin composition according to claim 2, wherein said light-reflecting metal layer is aluminum.

8. The polyester resin composition according to claim 2, wherein said molded article has at least a part on which said light-reflecting metal layer is directly formed.

9. The light-reflecting molded article according to claim 1, wherein said polyester resin composition includes 100 parts by weight of polybutylene terephthalate resin and 1 to 100 parts by weight of polyalkylene naphthalate resin.

10. The light-reflecting molded article of claim 1 wherein said polybutylene terephthalate resin has a content of carboxyl group at an end of a polymer chain that is, at most, 70 meq/kg.

11. The light-reflecting molded article of claim 1 wherein at least 75%, by molar fraction, of a 1,4-butanediol unit is contained in the total diol component of said polyalkylene naphthalate resin.

12. The light-reflecting molded article according to claim 1, wherein said light-reflecting metal layer exhibits a specular gloss.

13. The light-reflecting molded article according to claim 1, wherein said polyester resin composition includes 100 parts by weight of polybutylene terephthalate resin and 1 to 50 parts by weight of polyalkylene naphthalate resin.

14. The light-reflecting molded article according to claim 1, wherein said light-reflecting metal layer is aluminum.

15. The light-reflecting molded article according to claim 1, wherein said molded article has at least a part on which said light-reflecting metal layer is directly formed.

* * * * *

UNITED STATES PATENT AND TRADEMARK OFFICE
CERTIFICATE OF CORRECTION

PATENT NO.    : 6,629,769 B2                                         Page 1 of 1
DATED         : October 7, 2003
INVENTOR(S)   : Satoshi Kosugi et al.

It is certified that error appears in the above-identified patent and that said Letters Patent is hereby corrected as shown below:

<u>Column 12,</u>
Lines 31 and 35, change "claim 1" to -- 9 --.

Signed and Sealed this

Twenty-fifth Day of November, 2003

JAMES E. ROGAN
*Director of the United States Patent and Trademark Office*